United States Patent

[11] 3,610,202

[72] Inventor Erhard Sussmann
Poing, Germany

[21] Appl. No. 847,757
[22] Filed May 23, 1969
[23] Division of Ser. No. 515,304, Dec. 21, 1965, Pat. No. 3,486,933
[45] Patented Oct. 5, 1971

[73] Assignee Siemens Aktiengesellschaft
Berlin and Munich, Germany

[54] EPITACTIC APPARATUS
6 Claims, 1 Drawing Fig.

[52] U.S. Cl. .......... 118/48
[51] Int. Cl. .......... C23c 11/00
[50] Field of Search .......... 118/48–49.5; 117/106–107.2; 148/174, 175

[56] References Cited

UNITED STATES PATENTS

| | | | |
|---|---|---|---|
| 263,830 | 9/1882 | Weston | 118/49 X |
| 2,789,062 | 4/1957 | Cusáno et al. | 117/106 X |
| 3,053,638 | 9/1962 | Reiser | 118/49.5 X |
| 3,057,690 | 10/1962 | Reuschel et al. | 23/223.5 |
| 3,152,933 | 10/1964 | Reuschel | 118/49.5 X |
| 3,233,578 | 2/1966 | Capita | 118/49.1 |
| 3,235,418 | 2/1966 | Nickl et al. | 148/174 |
| 3,293,074 | 12/1966 | Nickl | 118/49.5 X |
| 3,330,251 | 7/1967 | Gutsche | 118/49.5 |
| 3,381,114 | 4/1968 | Nakanuma | 118/49.5 X |

*Primary Examiner*—Morris Kaplan
*Attorney*—Curt M. Avery

ABSTRACT: Apparatus for epitactic precipitation of semiconductor wafers. The apparatus comprises a reaction chamber with the disc to be processed arranged on the bottom of said reaction chamber. A gas inlet and outlet are arranged concentrically in the top of said reaction chamber. The wafers are heated to processing temperature by an electric heating device located beneath the bottom of the reaction chamber. This device extends areally to the upper surface parallel to the disc to be treated. A sleeve encloses the electric heating device and the lower portion of the reaction chamber and structurally connects the electric heating device with the reaction chamber.

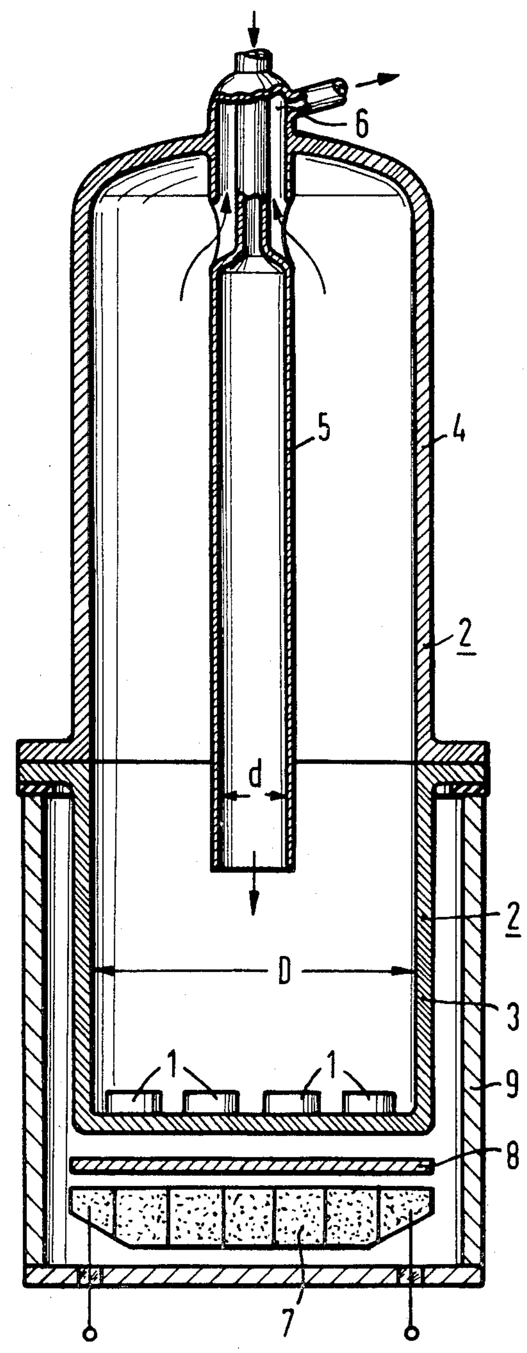
6
5
4
2
d
2
D
3
1
1
9
8
7

EPITACTIC APPARATUS

This is a division of application Ser. No. 515,304, filed Dec. 21, 1965, now U.S. Pat. No. 3,486,933, and relates to apparatus for epitactic precipitation of semiconductors.

Epitaxy is often used in the production of semiconductor structural members. This process consists in heating slices or wafers of semiconductor crystals, particularly monocrystals, to a high temperature below the melting point, while simultaneously passing a reaction gas across the wafers. At the wafer temperature, monocrystalline semiconductor material precipitates upon the wafers. The semiconductor crystals are heated mainly by electrical means, for example, by maintaining the wafers during the precipitation process, in direct contact with a carrier or heater consisting of heat-resisting, conducting material through which passes an electrical heating current. Alternatively, the wafers may contact an insulating intermediary layer which in turn contacts the carrier. Indirect heating of the wafers is also possible by absorption of an electromagnetic beam.

For purity of the precipitated semiconductor substance, the reaction gas used consists of only volatile compounds in which the semiconductor or the dopant is bonded to no other element than a halogen group and/or hydrogen. The reaction gas also contains hydrogen which is sometimes diluted by an inert gas.

In the epitactic production of semiconductor structural components, it is necessary to produce epitactic layers of uniform layer thickness and crystal quality. Furthermore, it is desirable that the tangential doping gradient vanishes identically in the precipitated layers. If several wafers in the same device are subjected to the precipitation process then all wafers must simultaneously meet these criteria.

It is an object of the invention to solve this difficult problem.

This invention relates to apparatus for carrying out a method for epitactic precipitation of a crystalline (poly- and monocrystalline) layer, particularly of semiconductor material, upon a heated semiconductor crystal substrate, particularly upon semiconductor wafers, from the gaseous phase. Reaction gas is passed through a reaction chamber containing the semiconductor crystals to be coated. My invention provides that the reaction gas flows into the reaction chamber with a Reynolds number no more than 50 and preferably about 40. It is preferable, according to the invention, that the gas input is effected from above through at least one inlet tube extending into the vertical, cylindrical tube in such a way that the reaction gas leaves the tube with a Reynolds number of maximum 50. After traversing a vertical path of a maximum distance equal to one and one-half times the diameter of the reaction chamber, measured above the bottom of the reaction chamber, at the height of the semiconductor wafers to be coated, the reaction gas impinges upon the substrate wafers arranged with their precipitation surfaces in a horizontal plane. The exhausted reaction gas is removed upwardly from the reaction chamber.

It is preferable that the flow of the reaction gas which is directed vertically downwardly, completely stops at the height of the substrate wafers or slightly below. In other words, that in the precipitation process, the wafers are placed on the bottom of the reaction vessel, which closes the reaction chamber downward, or upon an intermediate layer lying on said bottom and covering the latter, at least partially, and comprises particularly semiconducting or conducting material. This intermediary layer is such that it does not impair a uniform heat supply to the individual layers. This layer is either of a uniform overall thickness and quality or is so designed at the contact point for the wafers and on the rim, that more heat occurs at these localities than at the remaining localities.

As well known, the Reynolds number is a dynamic flow magnitude of viscous mediums and is used, for example, as a criteria for laminar or turbulent flow. If V constitutes the kinematic viscosity measured in Stokes, W the flow velocity and $\delta$ the hydrodynamic diameter of the vessel, traversed by the medium, then the Reynolds number is $$Re = w.\delta v$$

The condition that the Reynolds number is not to be larger than 50, should be observed within the gas inlet tube as well as within the reaction chamber.

The FIGURE of drawing shows the invented apparatus for performing the invented method. The layers which are to be epitaxially coated, particularly of Si or Ge, are indicated as 1 and are located on the planar bottom of a reaction vessel 2, which is essentially a right cylinder.

The reaction vessel 2 consists of a lower cup-shaped portion 3 and an upper portion 4 which is equipped with an inlet tube 5 for fresh reaction gas and an outlet 6 for exhausted reaction gas. Inlet and outlet for the reaction gas are preferably concentric to each other. It is preferred that all parts of reaction vessel 2 and of gas supply line, at least insofar as they border the reaction chamber, should consist of the purest possible quartz glass and/or BeO and/or SiC. If this is not possible for technical reasons, for example, wherein a heater located inside the reaction vessel, consists of conducting material, then the outside portion of such device is covered with (a) a highly pure coating of one of the named substances, (b) the material to be precipitated and/or (c) the semiconductor material of the substrate wafers. The substrate, upon which the wafers to be coated are located (in the present example the closing of the reaction chamber), should consist preferably of a commercially available type of quartz, in the spectral region of 2.6–2.8 $\mu$ as free as possible of absorption edges These quartz types of BeO or SiC are advantageously used at those localities at which a temperature of over 500°, occurs during operation. Moisture is eliminated from the reaction chamber, in the known manner.

The dimensions of the device necessary to obtain the Reynolds number and for the operational conditions are to be measured according to the teaching of this invention. This not only applies to the hydraulic diameter, which in the cylindrical instance corresponds with the actual diameter "*d*" of the gas supply 5 and the reaction chamber diameter "D"; but also to the flow velocity *w* of the reaction gas in inlet 5 and in the reaction chamber, as well as for the vertical distance "A" between the exit point of the reaction gas from the supply tube 5 and the wafers 1 to be coated. The above-mentioned formula for the Reynolds number, as well as commercially available gas flow velocity meters, provides that the method can be carried out with great reliability.

In connection with the described combination of the reaction vessel of parts 3 and 4, it should be pointed out that said combination makes it possible for the semiconductor wafers 1, which are already in a position required for precipitation, to undergo preparatory processing in other devices and, after coupling with the head portion 4 of the reaction vessel 2 and the heating means still to be described, to be subjected to an epitactic process without the necessity of further manipulations, particularly contacting of the wafers. Furthermore, this construction provides the possibility to maintain the wafers 1, following their described pretreatment, in a dust-free condition, by preferably keeping the contents of the pot-shaped bottom portion 3, when it is separated from the heat portion 4 of the precipitation vessel, under an excess pressure of an inert gas, for example, dry nitrogen and, subsequently, sealing it again from the outer chamber by means of an auxiliary cover, for example, a quartz plate. Since the edges of the pot-shaped bottom part 3 and the head part 4, which are to be brought into mutual contact, are provided with appropriate ground portions, an entirely adequate sealing may be obtained.

This may also be done with other treatment devices to be attached, unless it is preferred to insert the pot-shaped bottom part, together with its contents, completely into a treatment medium or treatment chamber, which is sealed off from the outer chamber in the required manner, and only then to remove the auxiliary cover.

An additional important aspect of my apparatus is in the design of the heating device. The heater may be located entirely outside the reaction vessel, so that the wafers 1 are heated to the required reaction temperature, through the bottom of the pot-shaped lower part 3, by heat conductance and/or thermal radiation. The heating device may be partly inside the reaction chamber as a carrier of conducting material, which is in direct or indirect contact with the wafers, and located in the induction field of an induction source outside of the reaction vessel. Finally, a galvanically heated carrier for the wafers may be arranged entirely within the reaction chamber.

In the first and in the last instance, the heater may very advantageously possess the configuration shown in the drawing. The actual current-traversed heating member 7 consists of a conductor of graphite or molybdenum, wound in a plane and passed by current, during operation. The windings may be, for example, spiral or meander-shaped. It is recommended that the conductor cross section of the heating member 7 be tapered toward its edge, in order to eliminate marginal decline of temperature. An equalizing plate 8 of ray-absorbing material, e.g. graphite or pyrographite, is provided between the wafers 1 to be coated and the heating member 7. The equalizing plate is preferably parallel to wafers 1 and the heating member 7.

If the heating source is located outside of the reaction vessel, it, and the cup-shaped bottom portion 3 of the precipitation device are arranged in a cup-shaped sleeve 9, which will be described further. The manner of the arrangement can be seen in the FIG. If the heater is within the reaction vessel, then the equalizing plate 8 is so constructed that it separates heater 7 from the reaction chamber. To assure the purity of the precipitated material, heater 7 is coated with a layer of the same semiconductor as is precipitated. If necessary, it may also serve as a carrier for the wafers 1. The conductors for heater 7 pass hermetically and possibly insulated through the wall of the bottom cup 3.

When the heater is only partly located within the reaction vessel, the portion of the heater arranged inside is preferably designed as is equalizing plate 8, when located outside of the reaction vessel. The outer portion is either an induction coil or a radiation heater.

Special attention must be given to the substrate upon which the wafers to be coated rest. In any event, the surface of the wafers 1 to be coated is markedly hotter than the carrier surface upon which precipitation is not to take place when in contact with the reaction gas. The wafers 1 should be hotter than all the remaining walls and device portions bording the reaction chamber. If the carrier for the wafers, e.g. the bottom of the reaction vessel, is heated by radiation, an appropriate tapering of the carrier at the bearing surfaces of the wafers is recommended.

When the walls of the reaction vessel, the carrier for the wafers 1, and other device portions located in the reaction chamber are appreciably heated during the precipitation process, then at the conclusion of the precipitation reaction, one should proceed according to the following sequence:

1. Quick discontinuation of the reaction gas;

2. quick disconnection of the heater;

3. the quickest possible substitution of the reaction gas present in the reaction chamber by pure hydrogen or another inert gas. It is therefore recommended to increase markedly the flow velocity over the inert gas over that of the reaction gas, by at least 1.5 times.

These steps should be carried out as quickly as possible in order to avoid films at the surface of the epitactically precipitated semiconductor layers.

If the carrier of the semiconductor discs to be coated is not also the heater, then it is preferred to place the heater in a separate, closed chamber. This also applies when the heater is located outside the reaction vessel 2. This sealed-off space is favorably filled with inert gas in order to avoid oxidation of the heater 7 which consists of graphite or the like. The equalizing plate 8 may then serve as an upper seal for the area surrounding the heater. It is even better if, instead of the equalizing plate 8, the lower portion 3 of reaction vessel 2 seals off the heater area, as shown in the drawing. In this example, sleeve 9, which is preferably coolable and extending close to the connection of the two parts 3 and 4 of the reaction vessel, constitutes the outer wall of the heating chamber. Though it is recommended on one hand that the cup-shaped lower portion 3 of the reaction vessel 2 be removable from sleeve 9 as desired, care should be taken this chamber is also gastight, possibly by the use of a seal. To this end, it is suggested, especially if the bottom of lower portion 3 consisting of quartz, is the carrier for the crystals 1, that the inert gas pressure in the heating chamber is such that it balances the gas pressure in the reaction chamber and the effect of the gravity force on the bottom of the lower portion 3. This can prevent a sagging of the bottom and of the carrier of the wafers 1 to be coated, which make a uniform precipitation impossible.

To reiterate the essential features of the invented apparatus:

a. The semiconductor bodies to be coated, especially of Si or Ge, rest in a horizontal plane at the bottom or near the bottom of a vertical cup-shaped vessel, preferably made of quartz, BeO or SiO.

b. The reaction gas inlet into the reaction chamber is at least one tube extending into the reaction chamber from above. The gas escapes at the top of the vessel.

c. The flow of gas through the reaction vessel occurs with a maximum Reynolds number of 50.

d. The distance of the mouth of the gas inlet from the plane wherein the crystals 1, to be coated, are located less than 1.5 times the hydraulic diameter of the reaction vessel.

e. The heating of the semiconductor to be coated is performed by heat conductance from the carrier and/or through thermal radiation through the carrier upon which rest the semiconductor bodies, to be coated. The carrier is preferably heated by the radiation of a wound-heating source through which passes a current as is located outside of the reaction chamber. The heating source may also be heated by the direct passage of an electric current or by induction. Generally, the semiconductor wafers 1 are heated through the insertion of an electric and/or electromagnetic field upon a heater, which is kept in direct or indirect contact with the substrate wafers or placed upon the substrate wafers directly.

f. The heating source made of heat-resistant material, e.g. graphite, molybdenum, or tantalum, which is wound in a plane and is preferably circular, has reduction in its cross section near its rim or edge for the purpose of increasing the rim temperature. A temperature equalizing plate 8, made of ray-absorbing material, e.g. graphite, lies between the carrier and heater. This equalizes the heating of the carrier and which may per se serve as a carrier. The heating system, in the case of radiation heating of the carrier, is located in a cooled metal sleeve 9 which is flooded with protective gas and into which extends the cup-shaped bottom portion 3 of the reaction vessel 2. This protective gas, among other things, helps avoid unnecessary space heating.

g. The carrier for the semiconductor bodies 1 to be coated is either the bottom of the cup-shaped reaction vessel 2, preferably coated with a layer of the semiconductor material to be precipitated, or an insert plate of highly pure graphite, silicon carbide graphite with a silicon carbide coating, beryllium oxide or semiconductor material, which is near or on the bottom of the reaction vessel.

h. The carrier and/or the heating system are so designed that their temperature at the places where the to-be-coated semiconductor wafers are located is at least 20° higher than the temperature at the locations not covered by semiconductor bodies. This may be obtained, for example, by weakening the walls at the respective places or increasing the heat resistance.

i. If the cup or pot-shaped reaction vessel 2 consists of highly pure quartz, then a type of quartz is used, at least for its bottom 3, which has no or only a slightly absorption edge between a wave length of 2.6 and 2.8 $\mu$.

j. The reaction chamber is so designed that bottom 3, wherein the semiconductor wafers 1 to be coated rest, forms together with the heating container in a gas and dusttight sealed state. The loading of this part 3 with the semiconductor bodies 1, to be coated, may preferably take place outside the metal pot (container) 9 in a dust-free, inert atmosphere. It further becomes possible through the application of layer sequences of various doped semiconductor materials or others, particularly insulated or metallic layers, to couple the lower portion 3 with the semiconductor bodies 1 to be coated, without manipulating the latter, with various upper parts 4, which are particularly appropriate to the precipitation of the individual materials. The coupling between lower portion 3 and upper portion 4 is gastight and dust-free k. When using a quartz reaction vessel, the pressure of the inert gas in the heating chamber 9 is at a value sufficiently high that it exerts upon the quartz bottom of the pot 9, an upward force which balances the forces which act downwardly upon the quartz bottom.

l. In order to avoid the "back-etch effect" it is favorable to pretreat the semiconductor wafers 1, resting on the carrier 6 which is coated with a usually slightly doped semiconductor material. The pretreatment is carried out prior to the start of precipitation at an increased temperature, e.g. precipitation of Si, precipitation on Si-bodies 1 at 1,100° C. with a pure, dry $HCl$ and $H_2$ containing gas.

m. The rate of growth is adjusted with the mol ratio, according to the described flow conditions, to a value of maximum 3 $\mu$/min.

n. The precipitation is thus brought to an end that after cutting off the supply of gas, containing the semiconductor to be precipitated, and after reducing the temperature of the substrate wafers, hydrogen or another inert gas with at least 1.5 times the flow velocity of the previously used reaction gas is passed through the reaction chamber.

The combination of the above-described measures yields particularly favorable results. A number of them are preferable in their own right, particularly the previously described heating and flowing measures, may be used independently of each other. Thus, the condition for the Reynolds number is used favorably to avoid notable edge bulges in the epitactic layers and other irregularities, independent of other details in the reaction device.

The semiconductors germanium and silicon are to be considered as foremost in the precipitation process. The composition of gases for epitaxy precipitation are known per se. However, the application of the above-described method may be transferred in virtually all its details, without much change, to the epitaxy of other semiconductors and nonsemiconductors.

I claim:

1. Apparatus for epitactic precipitation of semiconductors, upon heated semiconductor wafers by an appropriate reaction gas, said apparatus comprising a cylindrical reaction chamber on whose bottom the wafers to be coated are received, an inlet pipe for supplying fresh reaction gas from above extending into the reaction chamber, a gas outlet concentrically arranged with said gas outlet at the top of the reaction chamber, seated beneath said reaction chamber is an electrical heater which extends areally parallel to the bottom of said reaction chamber and heats the semiconductor wafers, a temperature compensation plate is disposed between said heater and said bottom to equalize the heating of the wafers when in operation, at least the bottom of said reaction chamber is of a material selected from the group consisting of quartz, BeO and SiC, said electrical heater and temperature-compensating plate being disposed within a cup-shaped sleeve which encompasses, in spaced-apart relationship, substantially the bottom half of said reaction chamber and is sealed at its top edge to the reaction chamber.

2. Apparatus according to claim 1, wherein the reaction chamber consists of an upper portion equipped with said gas inlet and said gas outlet and a lower, cup-shaped portion which receives the semiconductor wafers to be coated, the two portions connectable to each other, in a gastight manner.

3. Apparatus according to claim 2, wherein the lower and the upper portions of the precipitation device are fitted to each other by polished surfaces.

4. Apparatus according to claim 2, wherein the marginal decline of the temperature of the heater in compensated by appropriate tapering of the heater.

5. Apparatus according to claim 4, wherein the connection between said sleeve containing the heater and equipped with gastight walls and the bottom portion of the reaction vessel, may be separated and is gastight.

6. Apparatus according to claim 5 wherein the sleeve is provided with a cooling device.